United States Patent [19]

Sekiguchi

[11] 4,400,666
[45] Aug. 23, 1983

[54] FIXED RATE DELAY CIRCUIT

[75] Inventor: Takuji Sekiguchi, Machida, Japan

[73] Assignee: Nippon Hoso Kyokai, Tokyo, Japan

[21] Appl. No.: 227,740

[22] Filed: Jan. 23, 1981

[30] Foreign Application Priority Data

Jan. 29, 1980 [JP] Japan .................................. 55-8349

[51] Int. Cl.$^3$ ............................................ H03K 5/135
[52] U.S. Cl. ................................ 328/130.1; 307/602; 328/75
[58] Field of Search .................... 328/48, 129, 130, 75; 307/602, 608

[56] References Cited

U.S. PATENT DOCUMENTS

| | | | |
|---|---|---|---|
| 3,697,879 | 10/1972 | Holliday | 307/602 |
| 4,011,517 | 3/1977 | Pommerening et al. | 328/130 |
| 4,016,495 | 4/1977 | Machanian | 328/48 |
| 4,068,179 | 1/1978 | Sample et al. | 328/130 |
| 4,127,823 | 11/1978 | Frost | 328/130 |

Primary Examiner—John S. Heyman
Attorney, Agent, or Firm—Parkhurst & Oliff

[57] ABSTRACT

A binary number $2^n$ can be divided at a rate $2^m$ by means of shifting down successive digits thereof by m digits, n and m being positive integers which have a relation $n > m$ therebetween. According to the above principle, successive digits of a binary number, which represents the number of clock pulses corresponding to an immediately preceding pulse interval of a pulse sequence having pulse intervals varied every moment, are shifted down by m digits. Thereafter, the coincidence between those shifted down successive digits and successive digits of a binary number which represents the number of clock pulses corresponding to a required fixed rate delay time is detected through plural exclusive OR gates, so as to find an instant to which the pulse sequence should be delayed. As a result, the fixed rate delaying of the pulse sequence can be effected at the rate $\frac{1}{2}^m$ of the immediately preceding pulse interval. This fixed rate delaying of the pulse sequence is particularly fit for the clock pulse reproduction in a digital VTR or a PCM recorder operating at varied speeds. The above fixed rate delaying of the pulse sequence can be efficiently employed for a digital frequency multiplier and a digital frequency differential discriminator.

7 Claims, 11 Drawing Figures

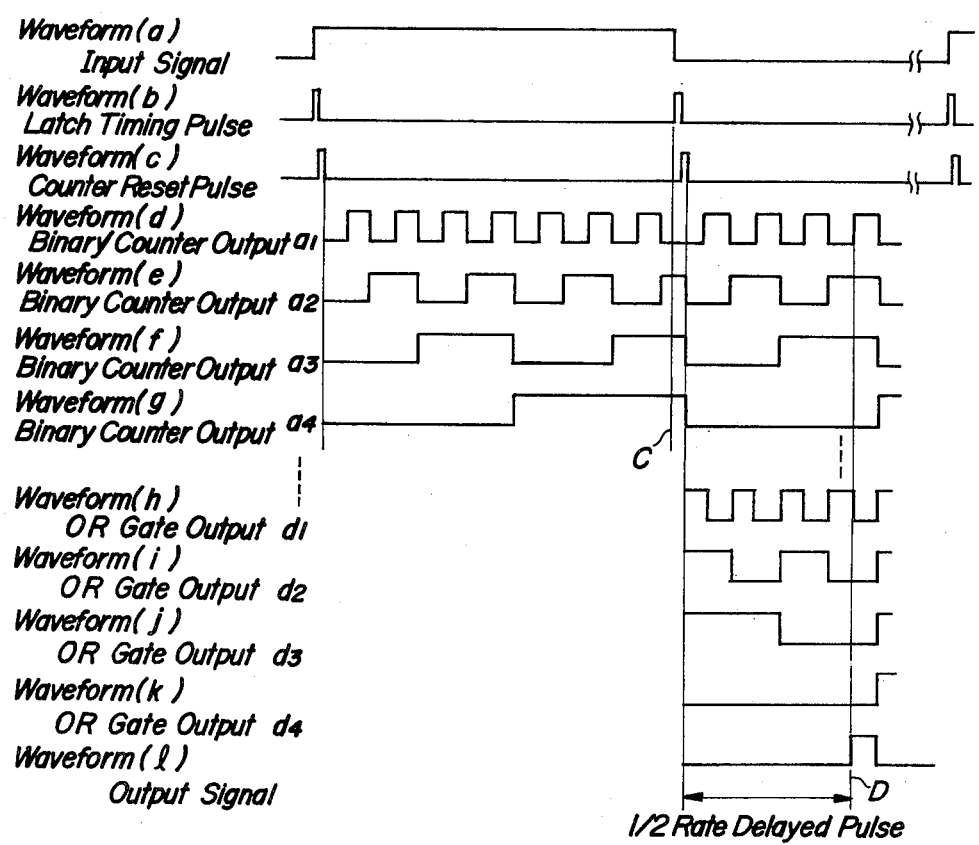

FIXED RATE DELAY CIRCUIT

BACKGROUND OF THE INVENTION (1) Field of the Invention

The present invention relates to a fixed rate delay circuit wherein pulse intervals of an input pulse sequence are successively measured and, in response to a result thereof, an output pulse sequence is produced in which each pulse is delayed at a fixed rate with respect to the immediately preceding pulse interval. The output pulse sequence can be obtained even if these measured pulse intervals are varied every moment.

(2) Description of the Prior Art

Recently, with the progress of digital techniques, a SMPTE digital time code is used as an editorial code for editing by a video tape recorder (VTR). In the process of editing video signals it is required to extract timing information from a digital information signal having a signal form such as an editorial code for which the SMPTE time code is customarily used. In the ordinary reproduction of the VTR at a fixed tape speed, clock-pulses contained in the reproduced digital information signal are spaced at equal intervals, so that it is possible to extract those clock-pulses therefrom by a conventional clock reproducing circuit.

On the other hand, in the editing of video signals by the VTR, the search of pictures by high speed reproduction and the confirmation of cuts by slow speed reproduction are required in response to the editor's demand or the contents of pictures. Also, the continuously variable speed reproduction is indispensable for the efficiency and convenience of the editing. In such a variable speed reproduction of the VTR, clock-pulses contained in the reproduced editorial codes are no longer spaced at equal intervals. Besides, in the high speed reproduction of the VTR, the tape speed is not controlled so accurately as in the ordinary speed reproduction. Also, the time code is customarily recorded in a longitudinal direction of a magnetic tape by a fixed magnetic head, so that the pulse intervals of the clock-pulses which are obtained in the high speed reproduction are fluctuated in response to the fluctuation of the tape speed. Consequently, since the pulse intervals of the reproduced clock-pulses have a difference of hundreds of times between the high speed reproduction and the slow speed reproduction, it is required to realize a clock reproduction circuit in which the faithful clock reproduction can be attained by stably and securely extracting the clock timing, even if the pulse intervals thereof are varied extensively as mentioned above.

On the other hand, regarding a type of digital information signal fitted for the editing thereof carried out by employing the digital VTR in which pulse intervals of reproduced clock-pulses are varied as mentioned above, a digital information signal of biphase modulation type, for instance, biphase space type, biphase mark type and the like, is known. In this type of digital information signal, bits of information data consisting of "1's" and "0's" are separately arranged between equally spaced clock components, and digital information is discriminated on the basis of the existence of those separately arranged information bits. The digital information signal of this type is frequently adopted for the editing of video signals, since the faithful reproduction of information can be attained, even if the reproduction of various modes, for instance, high speed, slow speed and reverse direction reproductions are carried out by the digital VTR accompanied with excessive jitters of clock timing. However, even though the digital information signal of biphase modulation type is adopted, the above-mentioned clock reproduction circuit is also required for effecting the stable and reliable reproduction of variable speed clock-pulses therefrom.

For the stable and reliable reproduction of variable speed clock-pulses such as mentioned above, it is sufficient successively to detect the pulse intervals thereof and then to produce a pulse sequence, each pulse of which is delayed at the fixed rate regarding the immediately preceding detected pulse interval in order, for the following reason.

The clock-pulses are equally spaced by nature in the ordinary state, even when other information bits are separately interposed between them. In contrast therewith, the variation of the tape speed of the VTR occurs gradually at a time duration being far longer than pulse intervals thereof. Thus each pulse of the clock pulse sequence can be extracted by gating it with a gating signal stretched between two successive pulses of the clock pulse sequence. The two successive pulses are delayed respectively at a fixed rate regarding the immediately preceding pulse intervals thereof, according to the prediction based on the immediately preceding pulse interval detected for discriminating clock pulses from the interposed other information bits.

For the above reason, a fixed rate delay circuit is indispensable for the stable and reliable reproduction of clock pulses having extensively varied pulse intervals. However, a conventional delay circuit is formed of a monostable multivibrator or a delayed pulse generator having a CR time constant for generating delayed pulses. Thus, in the conventional delay circuit, it is impossible to effect the above-mentioned fixed rate delay for varying the delay time in response to the variation of pulse intervals in the pulse sequence having extensively varied pulse intervals.

On the other hand, it is true that, in order to perform the above-mentioned fixed rate delaying, a pulse phase locked logic circuit, namely, a so-called PLL circuit has been customarily used for forming a fixed rate delayed pulse based on an average pulse interval. Also, a complicated operation circuit has been traditionally used for forming the fixed rate delayed pulse based on the immediately preceding detected pulse interval. However, these conventional fixed rate delay circuits cannot follow the extensive variation of pulse intervals as mentioned above, and besides are provided with the extremely complicated circuit configuration, so that these conventional circuits have many serious defects in practical use.

SUMMARY OF THE INVENTION

An object of the present invention is to provide a fixed rate delay circuit having a simple circuit configuration for stably and securely generating a delayed pulse sequence having a fixed rate delay time with respect to an immediately preceding pulse interval in order.

Another object of the present invention is to provide a fixed rate delay circuit which is suitable for forming a clock reproduction circuit in order to extract clock-pulses from a reproduced digital information signal of biphase modulation type by detecting a clock timing therefrom.

Still another object of the present invention is to provide a fixed rate delay circuit which is suitable for reproducing clock-pulses from digital video and audio signals reproduced at varied speeds by detecting a clock timing therefrom.

Another object of the present invention is to provide a fixed rate delay circuit which is suitable for forming a digital frequency multiplier having an arbitrary integral rate of multiplication.

Still another object of the present invention is to provide a fixed rate delay circuit which is suitable for forming a frequency differential discrimination circuit used for a wide frequency range.

The feature of the present invention is as follows. A binary number $2^n$ can be divided at a rate $2^m$ by means of shifting down successive digits thereof by m digits, n and m being positive integers which have a relation $n > m$ therebetween.

Accordingly, successive digits of a binary number, which represents the number of clock pulses corresponding to an immediately preceding pulse interval of an input pulse sequence having pulse intervals varied every moment, are shifted down by m digits. Thereafter, the coincidence between those shifted down successive digits and successive digits of a binary number which represents the number of clock pulses corresponding to a required fixed rate delay time is detected through plural exclusive OR gates, so as to find an instant to which the pulse sequence should be delayed. As a result, a fixed rate delaying of the pulse sequence can be effected at the rate $\frac{1}{2}^m$ of the immediately preceding pulse interval.

BRIEF DESCRIPTION OF THE DRAWINGS

For the better understanding of the invention, reference is made to the accompanying drawings, in which:

FIG. 2 is a diagram showing signal waveforms at various portions thereof;

DETAILED DESCRIPTION OF THE PREFERRED EMBODIMENTS

Figure 1A:
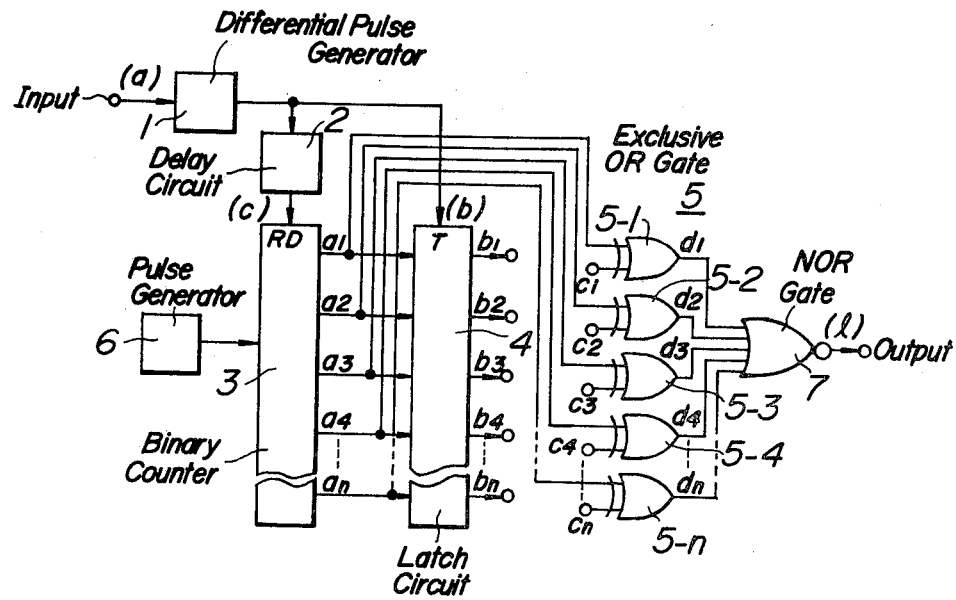
FIGS. 1(a) and (b) are block diagrams showing embodiments of a fixed rate delay circuit according to the present invention and a differentiating and fixedly delaying circuit used therefor respectively.

Firstly, the principle of the fixed rate delay according to the present invention for realizing the aforesaid feature thereof will be explained hereinafter.

A decimal number corresponding to a binary number, which is formed by shifting down by one digit the configuration of "0" and "1" at successive digits of an original n digit binary number corresponding to an original decimal number, corresponds to $\frac{1}{2}$, namely, one half of the original decimal number. Similarly, another decimal number corresponding to another binary number which is formed by shifting down by two digits the configuration of "0" and "1" at successive digits of the original binary code, corresponds to $\frac{1}{2}^2$, namely, one fourth of the original decimal number. Generally speaking, when "m" is a positive integer being smaller than aforesaid "n", still another decimal number corresponding to still another binary number which is formed by shifting down by m digits the configuration of "0" and "1" at successive digits of the original binary number, corresponds to $\frac{1}{2}^m$, namely, one $2^m$-th of the original decimal number. For example, a binary number "0 . . . 00110", which is formed by shifting down by one digit the configuration of "0" and "1" at successive digits of an original binary number "0 . . . 01100" corresponding to an original decimal number "12", corresponds to a decimal number "6", namely, one half of the original decimal number "12". Similarly, another binary number "0 . . . 00011", which is formed by shifting down by two digits the configuration of "0" and "1" at successive figures of the original binary number of "0 . . . 01100", corresponds to another decimal number "3", namely, one fourth of the original decimal number "12".

According to the present invention, for the purpose of obtaining a delay time presented by $\frac{1}{2}^m$, namely, one $2^m$-th of an original decimal number corresponding to a result of counting the number of clock-pulses, which represents a pulse interval of an input pulse sequence, by utilizing the above-mentioned relations between binary numbers, successive digits of an original binary number corresponding to the original decimal number are temporarily registered by a composite latch circuit in order. Then a delayed binary number is formed by shifting down by m digits the configuration of "0" and "1" at successive digits of the registered binary number, so as to be compared with a succeeding binary number representing a succeeding result of counting of clock-pulses. The required delay time corresponding to $\frac{1}{2}^m$, namely, one $2^m$-th of the pulse interval of the input pulse sequence can be obtained by detecting the coincidence of each of successive digits between the delayed binary number and the succeeding binary number in the comparison therebetween.

More specifically, the above registered and m-digit shifted down binary number and the above succeeding binary number which represent the successive results of counting of numbers of clock-pulses corresponding respectively to successive pulse intervals of the input pulse sequence, are applied to a number of exclusive OR gates individually at successive digits thereof in order. In those exclusive OR gates, outputs of "0" are obtained at the coincidence between inputs, while outputs of "1" are obtained at the discordance between inputs. Thus, when successive digits of the above registered and m-digits shifted down binary number and those of the above succeeding binary number coincide with each other respectively, outputs of "0" can be obtained from all of those exclusive OR gates. Accordingly, an output of NOR gate applied with the outputs of those exclusive OR gates becomes "1" at the above coincidence, which is attained when a time duration corresponding to $\frac{1}{2}^m$, namely, one $2^m$-th of the pulse interval of the input pulse sequence expires, so as to indicate the required delay time of a fixed rate $\frac{1}{2}^m$.

Figure 1B:
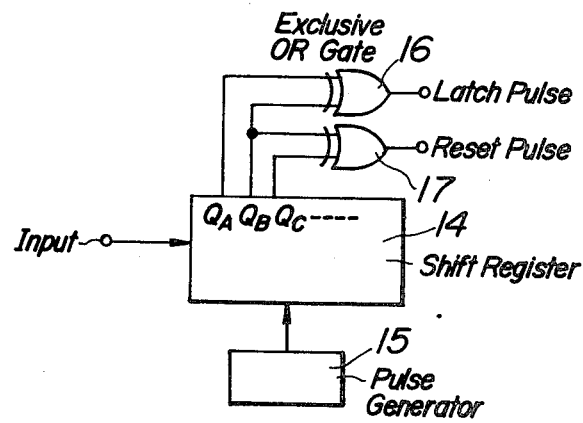

An embodiment of a fixed rate delay circuit for realizing the above-mentioned principle of the present invention is shown in FIG. 1(a) and a detailed configuration of a part thereof is shown in FIG. 1(b), and further signal waveforms at various portions thereof are shown in FIG. 2.

In a basic configuraton of the fixed rate delay circuit according to the present invention, a pulse generator 6 generates a clock-pulse sequence which has an extremely shorter repetition interval in comparison with that of an input pulse sequence to be delayed at a necessary fixed rate, so as to be employed as clock-pulses used for the logic operation of the fixed rate delaying. Those clock-pulses are applied to a binary counter 3, and successive digits $a_1, a_2, \ldots, a_n$ of a binary number obtained as a result of counting of those clock-pulses applied to the binary counter 3 are applied in parallel to a composite latch circuit 4. Among those successive digits $a_1, a_2, \ldots, a_n$, $a_1$ is the least significant and $a_n$ is the most significant.

In FIG. 2, which shows examples of signal waveforms at various portions of the fixed rate delay circuit shown in FIG. 1(a) in the situation where the delay at a fixed rate of $\frac{1}{2}$ is effected, waveforms (d), (e), (f) and (g) present examples of the successive digits $a_1, a_2, a_3$ and $a_4$ of the binary number as the result of clock-pulse counting in the above situation respectively.

Generally speaking aside from the above examples of the fixed rate $\frac{1}{2}$, in the embodiment of the fixed rate delay circuit as shown in FIG. 1(a), an input digital information signal of biphase modulation type having a waveform such as shown by waveform (a) in FIG. 2 is applied to a differential pulse generator 1. In this pulse generator 1, a sequence of differential pulses having such waveforms as shown by waveform (b) in FIG. 2 is obtained at each of leading edges and trailing edges of the waveform (a) of the input digital information signal in order to employ those differential pulses for latch signals and reset pulses as described later. However, in the situation where a suitable input digital signal consisting of a pulse sequence, each pulse of which has originally a suitable pulse form for those latch signals and reset pulses such as shown by waveform (b) in FIG. 2, it is of course that the above-mentioned differential pulse generator 1 can be dispensed with in the fixed rate delay circuit according to the present invention.

Aside from the above, the aforesaid sequence of differential pulses is applied to the composite latch circuit 4 as latch signals as well as to a fixed delay circuit 2, so as to delay each pulse of this sequence by a minute time duration being sufficiently shorter than repetition intervals of the aforesaid clock-pulses used for the logic operation of the fixed rate delaying. Those repetition intervals are equal to a pulse width of a binary counter output $a_1$ at the least significant digit as shown by waveform (d) in FIG. 2. The delayed sequence of differential pulses which is derived from the fixed delay circuit 2 with pulse forms such as shown by waveform (c) in FIG. 2 is applied to the binary counter 3 as reset pulses. Accordingly, as is apparent from waveforms (b) to (g) in FIG. 2, the successive digits $a_1, a_2, a_3$ and $a_4$ of the binary number representing the result of counting of the number of clock-pulses corresponding to an immediately preceding pulse interval of the input pulse sequence, which binary number is derived from the binary counter 3, are registered in the composite latch circuit 4 in response to the application of the above latch signal, and then read out therefrom as registered successive digits $b_1, b_2, b_3$ and $b_4$. Immediately thereafer, the binary counter 3 is reset in response to the application of the aforesaid reset pulse, so as to repeat the counting of clock-pulses as shown by waveforms (d) to (g) in FIG. 2. At this instant, the above registered successive digits are held on the above read-out terminals thereof.

As explained above, every time each pulse of the input pulse sequence or the sequence of differential pulses comes into the binary counter 3, the above mentioned clock-pulse counting is repeated in order to delay the input pulse sequence at the fixed rate of $\frac{1}{2}^m$. The successive digits $a_1, a_2, \ldots, a_n$ of the binary number obtained repeatedly by the clock-pulse counting in the binary counter 3 are applied to respective one inputs of a number of exclusive OR gates 5-1, 5-2, ..., 5-n. On the other hand, the successive digits $b_1, b_2, \ldots, b_n$ of the above registered and m-figure shifted down binary number derived from the composite latch circuit 4 are applied respectively to the other inputs $c_1, c_2, \ldots, c_n$ of those exclusive OR gates 5-1, 5-2, ..., 5-n. Further speaking in detail, those successive digits $b_1, b_2, \ldots, b_n$ of the above binary code derived from the composite latch circuit 4 are shifted down respectively by m figures, so as to form the m-digit shifted down successive digits $b_{1+m}, b_{2+m}, \ldots, b_n$, and then those shifted down successive digits $b_{1+m}, b_{2+m}, \ldots, b_n$ are applied respectively to the inputs $c_1, c_2, \ldots, c_{n-m}$ among those inputs $c_1, c_2, \ldots, c_n$. The remaining inputs $c_{n-m+1}, c_{n-m+2}, \ldots, c_n$ are applied with low logic levels L respectively. As a result, for instance, when it is required that the clock timing of the input pulse sequence such as the sequence of differential pulses obtained from the input digital information signal of biphase modulation type is extracted therefrom by delaying at the fixed rate of $\frac{1}{2}$, namely, one half of the pulse interval of the input pulse sequence, the inputs $c_1, c_2, \ldots, c_{n-1}$ of the exclusive OR gates 5-1, 5-2, ..., 5-n are applied with the successive digits $b_2, b_3, \ldots, b_n$ respectively, as well as the remaining input $c_n$ is applied with the low logic level L.

As mentioned above, the registered and m-figure shifted down binary number derived from the composite latch circuit 4 is applied to the inputs $c_1, c_2, \ldots, c_n$ of the exclusive OR gates 5-1, 5-2, ..., 5-n which are provided respectively at successive digits thereof, whenever the latch signal having the waveform (b) in FIG. 2 is applied to the composite latch circuit 4, and then is held as it is until an instant C shown in FIG. 2 at which the succeeding latch signal is applied thereto. Consequently, as often as the clock timing of the input pulse sequence, for instance, the differential pulses obtained from the input digital information signal, is varied, the delay time at the fixed rate "$\frac{1}{2}^m$" of the resultant new pulse interval, which is indicated by the m-digit shifted down binary number, is held at those inputs of the exclusive OR gates until the succeeding variation of the clock timing. On the other hand, the instantaneous successive digits $a_1, a_2, \ldots, a_n$, which are derived from the binary counter 3 and directly applied to the other inputs of the exclusive OR gates 5-1, 5-2, ..., 5-n, are renewed every moment, because the binary counter 3 is reset by the reset pulse having the waveform (c) which succeeds immediately after the latch signal having the waveform (b) and the renewed counting of clock-pulses representing the instantaneous pulse interval of the input pulse sequence is started repeatedly.

Additionally speaking, in the situation where the input pulse sequence to be applied to the fixed rate delay circuit according to the present invention consists of the differential pulses, which are obtained from the input digital information signal as described earlier, the differential pulse generator 1 is employed in just precedence to the fixed delay circuit 2.

The combination of those circuits 1 and 2 can be arranged in practice, for instance, as shown in FIG. 1(b). In a differentiating and fixedly delaying circuit as shown in FIG. 1(b), the input digital information signal having the waveform (a) is applied to a shiftregister 14, on which the aforesaid sequence of clock-pulses having the appropriate repetition interval being extremely shorter than that of the input digital information signal is also applied by another pulse generator 15, so as to shift the input digital information signal therethrough.

As a result, successively shifted pulses $Q_A$, $Q_B$, $Q_C$ and others, which are derived from the shiftregister 14 in response to successive signal levels "1" or "0" of the input digital information signal at each timing of the aforesaid clock-pulses applied for the shift thereof are applied to two exclusive OR gates 16 and 17 respectively successive two by two, so as to form the aforesaid latch signal and the aforesaid reset pulse. These signals can be derived from those exclusive OR gates 16 and 17 respectively, when respective two inputs thereof are different from each other in response to the level change, namely, at every leading and trailing edges, of the input digital information signal. Furthermore, the pulse generator 15 can be replaced with a pulse sequence which is formed by multiplying the clock-pulse sequence derived from the pulse generator 6 or by applying it as it is.

Aside from the above, in the exclusive OR gates 5-1, 5-2, . . . , 5-n which are applied respectively with the instantaneous successive digits $a_1, a_2, \ldots, a_n$ derived from the binary counter 3 and the registered and m-digits shifted down successive digits $b_{1+m}, b_{2+m}, \ldots, b_n$ in order, the low logic levels L can be derived from the outputs thereof, only when the respective two inputs coincide respectively with each other, whilst the high logic levels H can be derived from those outputs, when the respective two inputs are different respectively from each other, as described earlier. So that, for obtaining the output pulse sequence delayed at the fixed rate $\frac{1}{2}^m$ of the immediately preceding pulse interval of the input pulse sequence, it is required that the registered and m-figure shifted down successive digits $b_{1+m}, b_{2+m}, \ldots, b_n$ and the instantaneous successive digits $a_1, a_2, \ldots, a_{n-m}$, which are obtained by counting the clock-pulses corresponding to the succeeding pulse interval, coincide respectively with each other in those exclusive OR gates 5-1, 5-2, . . . , 5-n in order. As a result, the low logic levels L, namely, "0" outputs, can be obtained from those exclusive OR gates, and consequently the high logic level H, namely, "1" output can be obtained from the NOR gate 7 succeeding thereto as the fixed rate delayed pulse sequence.

For example, in the situation where, as shown by the waveforms (b) and (d) to (g) in FIG. 2, the result of counting of the clock-pulse representing the immediately preceding pulse interval of the input pulse sequence, which is derived from the binary counter 3 at the instant C at which instant the latch signal is applied to the composite latch circuit 4, becomes a binary number "0 . . . 01110" corresponding to a decimal number "14", and the output pulse sequence delayed at a fixed rate of m=1 for $\frac{1}{2}^m$, namely $\frac{1}{2}$ should be obtained, the above binary code "0 . . . 01110" is latched in the composite latch circuit 4 and shifted down by one digit by means of shifting down the order of connection therefrom to the successive exclusive OR gates 5. As a result, a shifted down binary number "0 . . . 00111" corresponding to one half of the original decimal number "14", namely "7", is applied to the inputs $c_1, c_2, \ldots, c_n$ of the exclusive OR gates 5-1, 5-2, . . . , 5-n in order, as well as another binary number presenting the succeeding result of clock-pulse counting, which is derived from the binary counter 3 reset immediately after the above preceding binary number is latched, is applied to the other inputs of those exclusive OR gates 5-1, 5-2, . . . , 5-n in order. Consequently, the outputs $d_1, d_2, \ldots, d_n$ of those exclusive OR gates 5-1, 5-2, . . . , 5-n are varied successively in response to the variation of the result of the clock-pulse counting started from an initial binary number "0 . . . 00000" in the binary counter 3, as shown successively by the waveforms (h) to (k) in FIG. 2, and then, at an instant D when the time duration of one half of the immediately preceding pulse interval of the input pulse sequence has just expired, the above result of the clock-pulse counting becomes another binary number "0 . . . 00111", which coincides perfectly with the previously latched and shifted down binary number. Thus, all of the successive figures $d_1, d_2, \ldots d_n$ derived from those exclusive OR gates 5-1, 5-2, . . . , 5-n become "0", namely, the low logic level L, and, as a result, the required pulse sequence delayed at the fixed rate of $\frac{1}{2}$ can be obtained.

On the other hand, in the situation where the result of clock-pulse counting, which is latched at the instant C, is a binary number "0 . . . 01111" corresponding to a decimal number "15", the output pulse delayed at the fixed rate of $\frac{1}{2}$ can be obtained at an instant when a resultant binary number "0 . . . 00111", which corresponds to another decimal number "7" formed by discarding a fraction of one half "7.5" of the original decimal number "15" as a whole number regarding the decimal point.

Consequently, in the fixed rate delay circuit according to the present invention, it is possible to obtain always stably and securely the fixed rate delayed pulse which is delayed from the latching instant by a time duration corresponding to the result of multiplying the immediately preceding pulse interval of the input pulse sequence at the fixed rate according to the result of clock-pulse counting at the latching instant.

Figure 3:
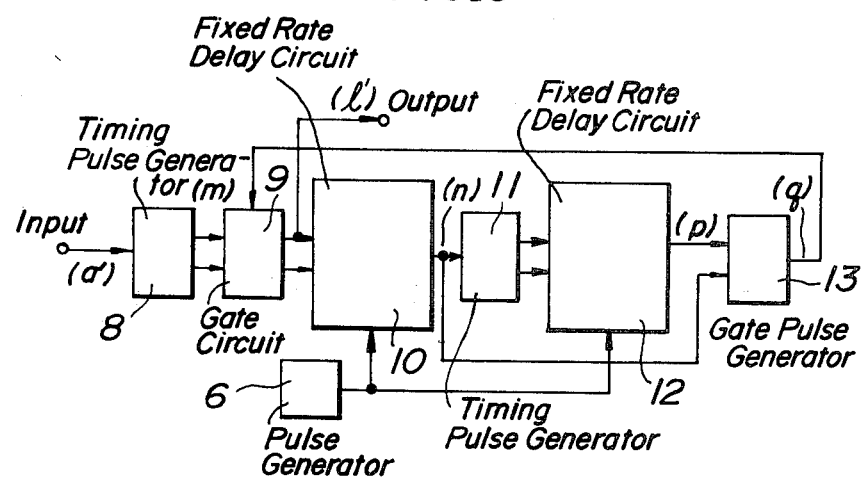
FIG. 3 is a block diagram showing an embodiment of a clock reproduction circuit consisting of a conbination of fixed rate delay circuits according to the present invention.
Figure 4:
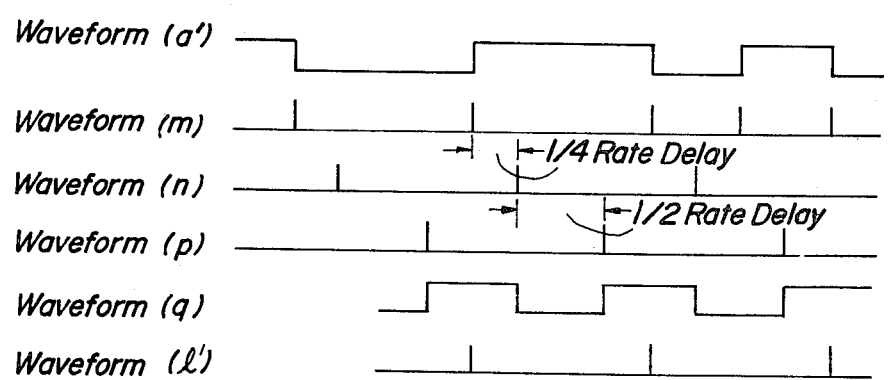
FIG. 4 is a diagram showing signal waveforms at various portions thereof.

Next, an example of a circuit configuration of a clock reproduction circuit comprising at least two fixed rate delay circuits according to the present invention, in which clock pulses having extensively varied pulse intervals can be extracted from a digital frequency modulation signal such as a digital information signal, for instance, of biphase mark type according to the IEC standard, which is customarily used for editing video signals by employing the VTR, will be explained by referring to FIGS. 3 and 4. In the latter drawing, signal waveforms at various portions thereof are shown.

In the editing of video signals by the VTR, the speed of reproduction of those video signals is varied extensively in response to the modes thereof, for instance, high speed reproduction, slow speed reproduction, play back and others, so that pulse intervals contained in the reproduced digital information signal are varied excessively. Accordingly, it is required to effect the clock reproduction from the reproduced digital information signal by stably and securely extracting the clock information therefrom on the strength of the succeeding clock timing predicted by detecting the immediately preceding pulse interval thereof. In the clock reproduction circuit constructed as shown in FIG. 3, for the purpose of forming a gate pulse used for extracting the succeeding clock pulse timing, which can be predicted by referring to the immediately preceding pulse interval of the input pulse sequence, by holding it between successive two pulses delayed respectively at fixed rates regarding thereto, leading and trailing edges of the gate pulse can be set stably and securely by referring to the result of detection of the immediately preceding pulse interval in the fixed rate delay circuit according to the present invention.

For example, in the situation where the clock-pulse sequence is reproduced from the digital information signal of biphase modulation type, the clock reproduction circuit shown in FIG. 3 is operated as follows.

Timing pulse generators 8 and 11, which correspond to the differentiating and fixedly delaying circuit as shown in FIG. 1(b), generate respectively both of such latch signals and reset pulses as described regarding FIG. 1(b) by being constructed similarly to the combination of the differential pulse generator 1 and the fixed delay circuit 2 as shown in FIG. 1(a). A ¼ rate delay circuit 10 and a ½ rate delay circuit 12 are respectively constructed by the combination of the binary counter 3, the latch circuit 4, the exclusive OR gates 5 and the NOR circuit 6 similarly as shown in FIG. 1(a), so as to delay an input pulse sequence respectively at fixed rates of ¼ and ½ regarding the immediately preceding respective pulse intervals.

An input digital information signal of biphase modulation type as shown by waveform (a') in FIG. 4 is applied to the timing pulse generator 8, so as to generate latch signals and reset pulses delayed slightly therefrom at every leading and trailing edge of the input digital information signal as shown commonly by waveform (m) in FIG. 4. Those latch signals and reset pulses are applied to the ¼ rate delay circuit 10 through a gate circuit 9, so as to be delayed at a fixed rate ¼ regarding a clock-pulse sequence contained in the input digital information signal similarly as described concerning FIG. 1(a) by employing operational clock-pulses applied from the pulse generator 6 similarly as in FIG. 1(a) and, as a result, to obtain a ¼ rate delayed pulse sequence as shown by waveform (n) in FIG. 4. The ¼ rate delayed pulse sequence is applied to the timing pulse generator 11, so as to generate latch signals and reset pulses similarly to those mentioned above, on the strength of the ¼ rate delayed pulse sequence. Those ¼ rate delayed latch signals and reset pulses are applied to the ½ rate delay circuit 12, so as to delay the ¼ rate delayed pulse sequence at the fixed rate ½ by employing the operational clock-pulses applied from the pulse generator 6 similarly as mentioned above. Consequently, as shown by waveform (p) in FIG. 4, a pulse sequence delayed at the fixed rate ¾ regarding the clock-pulse sequence originally contained in the input digital information signals can be obtained.

The above ¼ rate and ½ rate delayed pulse sequences are applied to a gate pulse generator 13, so as to generate a gate pulse having a leading edge coinciding with the ¾ rate delayed pulse sequence, which can be regarded seemingly as the ¼ rate advanced pulse sequence, and a trailing edge coinciding with the ¼ rate delayed pulse sequence, and, as a result, having a pulse width corresponding to one half of the immediately preceding pulse interval of the clock-pulse sequence contained originally in the input digital information signal is shown by waveform (q) in FIG. 4. The above gate pulse is applied to the gate circuit 9 which is provided on the input side of this clock reproduction circuit. Thus, once the genuine clock-pulse has been gated by the above gate pulse, it is possible to extract only the clock-pulse sequence as shown by waveform (1'), which is originally contained in the input digital information signal of biphase modulation type as shown by waveform (a'). As is apparent from the comparison between waveforms (m) and (q), all original clock pulses contained in the input pulse sequence (m) exist just on the gate pulse (q) having the pulse width of ½ of the pulse interval and further delayed by ½ of the pulse interval, whilst the other pulse representing the information of biphase modulation type exists between two successive gate pulses. Consequently, the original clock pulse sequence only can be reproduced by the above extraction as shown by waveform (1') in FIG. 4, whilst the other information pulse can be removed from the reproduced clock-pulse sequence.

In the situation where the gate pulse having the pulse width of one half of the above pulse interval, which is formed of the ¼ rate and ¾ rate delayed pulse sequences, is employed for the extraction of original clock-pulses, the allowable variation of the clock-pulse interval in the input digital information signal is ±25% thereof. However, it is also possible to vary the allowable variation of the clock-pulse interval by changing the fixed rate of delaying, as occasion demands. Besides, since the fixed rate delay is effected by the operational treatment of binary number in the fixed rate delay according to the present invention, the fixed rate delay can be stably and securely performed by a comparatively simple circuit configuration, whilst, since no more than the delay at a rate $\frac{1}{2}^m$ can be effected, a combination of at least two fixed rate delay circuits according to the present invention is required for performing the delay other than at the rate exceeding $\frac{1}{2}^m$, for instance, at a rate ¾.

On the other hand, for allowing the variation of the pulse interval of the clock-pulse sequence to be delayed at the fixed rate in the range from 1/N times to M times the regular pulse interval thereof, that is, in the range stretched over N×M times, it is necessary to employ operational clock-pulses having the repetition frequency of about ten times the highest repetition frequency of the input pulse sequence to be delayed at the fixed rate, and further to set the number K of digits of the binary number representing the result of clock-pulse counting effected by the binary counter substantially as follows:

$$K = log_2 (M \times N \times 10)$$

Besides, for increasing the precision of detection of the pulse interval of the input pulse sequence against the variation thereof, it is naturally required to select the further higher repetition frequency of the operational clock-pulses, as well as further to increase the number of digits of the resultant binary number formed by the binary counter.

Figure 5:
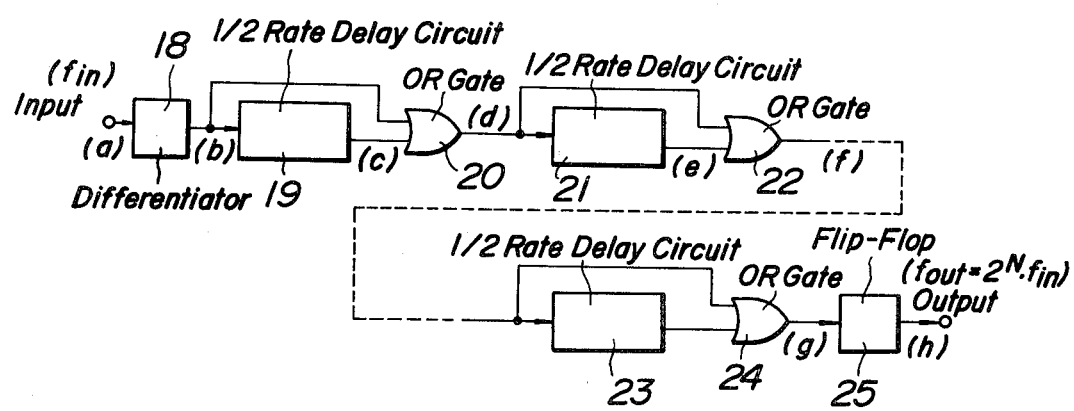
FIG. 5 is a block diagram showing an embodiment of a frequency multiplier consisting of a combination of fixed rate delay circuits according to the present invention.
Figure 6:
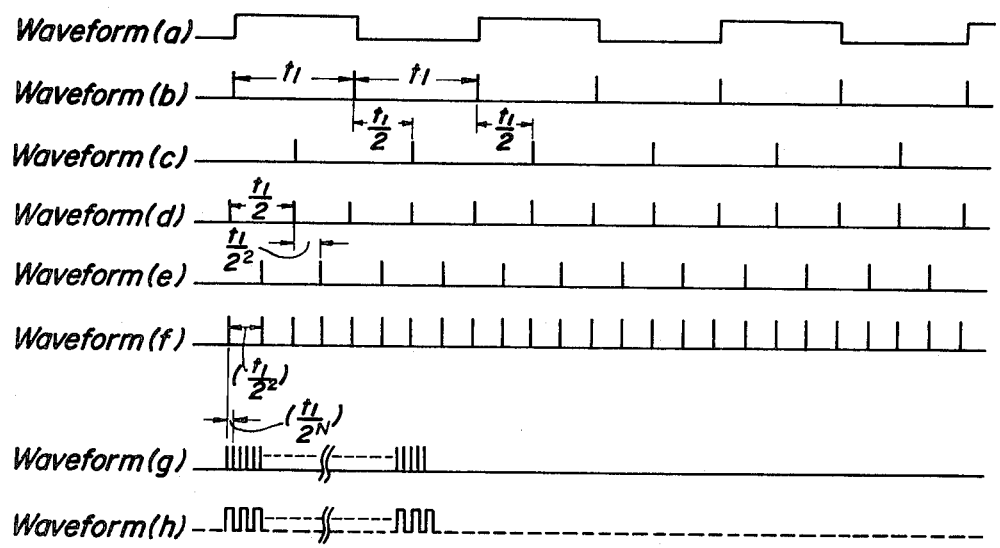
FIG. 6 is a diagram showing signal waveforms at various portions thereof.

As is apparent from the above, the fixed rate delay circuit according to the present invention is substantially independent of the pulse interval, namely, the repetition frequency of the input pulse sequence, so that it can not be employed only for the aforesaid clock reproduction, but for various other uses. For example, a frequency multiplier in which the fixed rate delay circuit according to the present invention is used for $2^N$-times multiplication of the repetition frequency of the input pulse sequence will be described by referring to FIGS. 5 and 6, the former showing an embodiment thereof and the latter showing signal waveforms at various portions thereof. As shown in FIG. 5, N twice multiplying stages formed respectively of OR gates 20, 22, ..., 24, which are respectively applied directly and through respective $\frac{1}{2}$ rate delay circuits 19, 21, ..., 23 with respective input pulse sequences, are connected in series for the $2^N$-times multiplication of the repetition frequency of the input pulse sequence. In this circuit configuration, a digital information signal having a waveform (a) as shown in FIG. 6 is applied to a differentiator 18, so as to obtain a differential pulse sequence having a repetition frequency $f_{in}$ and a waveform (b) as shown in FIG. 6. The differential pulse sequence (b) is applied to the $\frac{1}{2}$ rate delay circuit 19, so as to obtain a pulse sequence delayed by a delay time $t_1/2$ corresponding to one half of the original pulse interval $t_1$ of the input pulse sequence (b), as shown by a waveform (c) in FIG. 6. Consequently, a pulse sequence having a pulse interval of $t_1/2$ as shown by a waveform (d) in FIG. 6 can be derived from the OR gate 20 which is applied with the pulse sequences (b) and (c).

As is apparent from the above, every time the respective input pulse sequence is applied to one stage of the combination of the $\frac{1}{2}$ rate delay circuit and the OR gate, the respective output pulse sequence having the pulse interval corresponding to one half of that of the respective input pulse sequence, namely, the repetition frequency corresponding to twice that of the respective input pulse sequence, can be obtained. Consequently, by employing N stages of such a combination as mentioned above in series, it is possible to obtain an output pulse sequence having a pulse interval corresponding to $\frac{1}{2}^N$ of that of the input pulse sequence (b), namely, an output repetition frequency $f_{out}$ which corresponds to $2^N$-times the input repetition frequency $f_{in}$ of the input pulse sequence (b), as shown successively by waveforms (e) to (h) in FIG. 6.

For another example of various uses of the fixed rate delay circuit according to the present invention, another type of frequency multiplier in which M-th multiplication of the input repetition frequency is performed will be described by referring to FIGS. 7 and 8, the former showing an embodiment thereof and the latter showing signal waveforms at various portions thereof.

In these examples, N and M are positive integers having the relation $N>M$ therebetween, and further K is the smallest positive integer having a relation $K \geq 2^N/M$ therewith.

Figure 7:
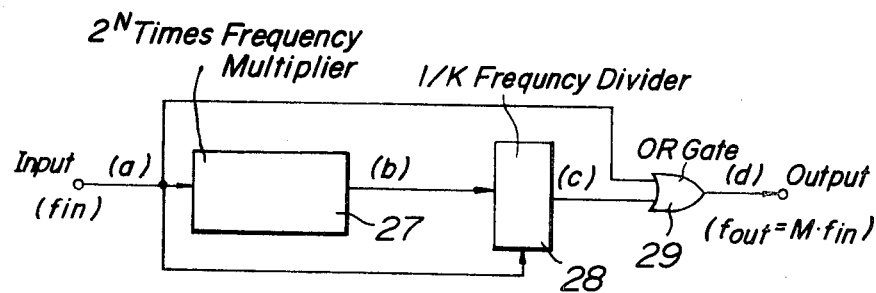
FIG. 7 is a block diagram showing another embodiment of the digital frequency multiplier consisting of a combination of fixed rate delay circuits according to the present invention.
Figure 8:
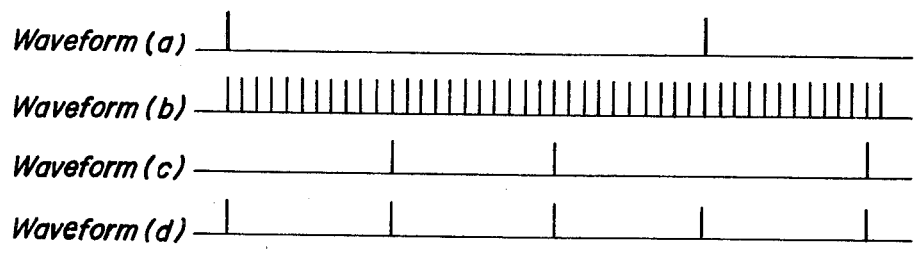
FIG. 8 is a diagram showing signal waveforms at various portions thereof.

In the circuit configuration as shown in FIG. 7, the input pulse sequence having a waveform (a) in FIG. 8 with the repetition frequency $f_{in}$ is applied to a $2^N$-times frequency multiplier 27 such as described above by referring to FIGS. 5 and 6, the output of which is connected to an input of a 1/K frequency divider 28 provided with a clear input which is applied with the input pulse sequence (a) regarding the situation where the integer K is appropriately selected. The input pulse sequence as shown by a waveform (a) in FIG. 8 and the 1/K divided pulse sequence as shown by a waveform (c) in FIG. 8, which is derived from the divider 28 applied with the $2^N$ times multiplied pulse sequence as shown by a waveform (b) from the multiplier 27, are applied together to an OR gate 29, so as to obtain an output pulse sequence having a pulse interval corresponding to one M-th of that of the input pulse sequence (a), as shown by a waveform (d) in FIG. 8.

For instance, in the situation where conditions such as $M=3$ and $N=5$ are attached for obtaining the output pulse sequence having the repetition frequency corresponding to three times that of the input pulse sequence, namely, the pulse interval corresponding to one third of that of the input pulse sequence, as shown by waveforms (a) to (d), a relation such as $K=11$ is set according to the above equation, so that the output repetition frequency corresponding to three times the input repetition frequency can be obtained by employing the 1/K frequency divider. Besides, it is apparent in practice that the periodic phase variation of the multiplied pulse sequence can be reduced, and, as a result, the accuracy thereof can be improved by setting the value of integer K under the condition that the integer N is enlarged according to the relation of $N>M$. Consequently, it is possible to obtain the arbitrarily multiplied repetition frequency regarding the input pulse sequence as mentioned above.

For still another example of various uses of the fixed rate delay circuit according to the present invention, a frequency differential discriminator will be described by referring to FIGS. 9 and 10, the former showing an embodiment thereof and the latter showing signal waveforms at various portions thereof.

When, in the $\frac{1}{2}^m$ rate delay circuit according to the present invention, the fixed rate is set as $\frac{1}{2}^0 = 1$, by setting $m=0$ for $\frac{1}{2}^m$, a pulse sequence is delayed by a delay time equal to the immediately preceding pulse interval of the input pulse sequence. It is possible on the basis of the above that the frequency differential discriminator is realized by applying a phase comparator with the original input pulse sequence and the resultant pulse sequence which is delayed by the delay time equal to the pulse interval thereof, for discriminating the variation of the differential of the repetition frequency of the input pulse sequence.

Figure 9:
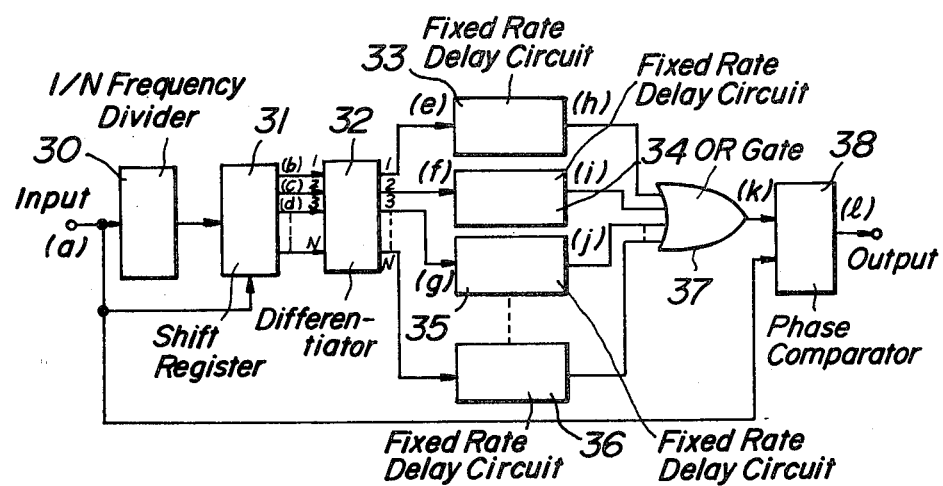
FIG. 9 is a block diagram showing an embodiment of a frequency differential discriminator consisting of a combination of fixed rate delay circuits according to the present invention.
Figure 10:
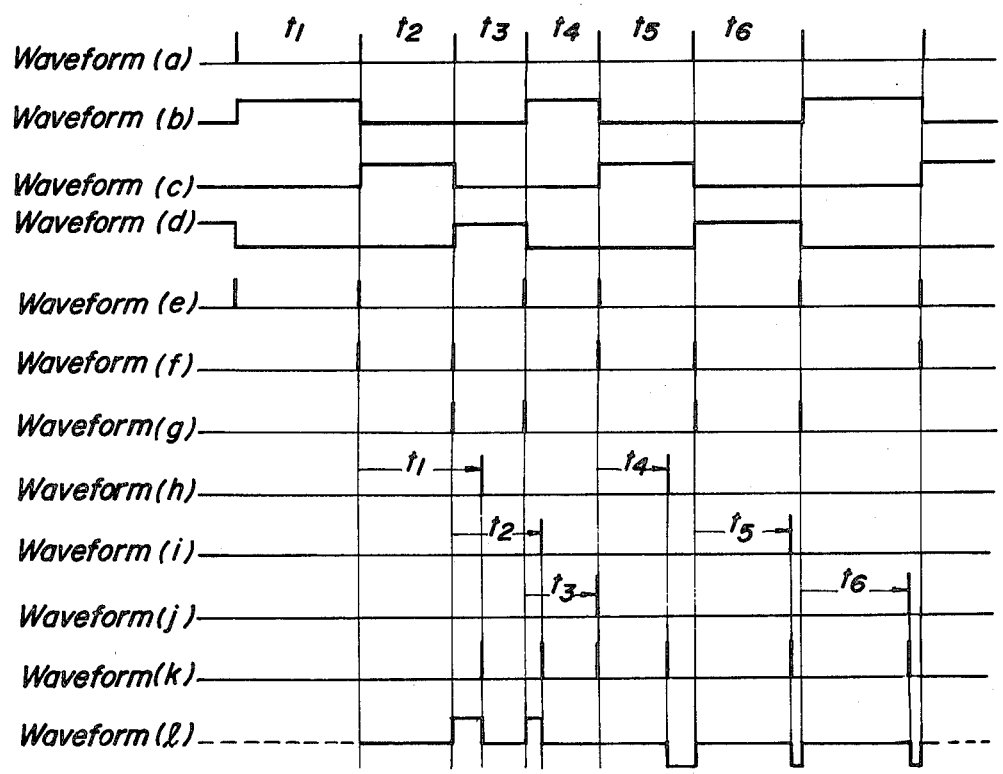
FIG. 10 is a diagram showing signal waveforms at various portions thereof.

In the circuit configuration as shown in FIG. 9, an input pulse sequence, pulse intervals of which are varied successively as shown by waveform (a) in FIG. 10, is applied to a 1/N frequency divider 30 regarding a positive integer N. The output of the 1/N frequency divider 30 is applied to a shift register 31 which is operated successively in response to the input pulse sequence (a) applied thereto. As a result, successive outputs of the shift register 31 form N series of pulse-interval sequences, each sequence of which consists of every other (N-1) pulse-interval in the input pulse sequence.

For instance, when the integer N is three, those successive outputs form a first series of every other two pulse-intervals $t_1$, $t_4$ and so on, a second series of every other two pulse-intervals $t_2$, $t_5$ and so on, and a third series of every other two pulse-intervals $t_3$, $t_6$ and so on, as shown respectively by waveforms (b), (c), and (d) in FIG. 10. Those successive outputs 1 to N of the shift register 31 as shown successively by waveforms (b), (c) and (d) are applied to a differentiator 32, so as to generate differential pulses at every leading and trailing edge of those successive outputs 1 to N respectively as shown successively by waveforms (e), (f) and (g). Those differential pulses are applied to the above-mentioned fixed rate delay circuits 33, 34, 35 and so on 36 having the above-mentioned fixed rate of $\frac{1}{2}^m$ regarding m=0, so as to obtain successively delayed differential pulses which are successively delayed by respective delay times equal to the immediately preceding pulse intervals as shown successively by waveforms (h), (i) and (j). Those delayed differential pulses are applied to an OR gate 37, so as to form a composite delayed differential pulse sequence as shown by waveform (k) in FIG. 10. This composite delayed differential pulse sequence (k) and the input pulse sequence (a) are applied to a phase comparator 38, so as to obtain an output signal as the result of discrimination of the phase relation between those pulse sequences (k) and (a) as shown by waveform (l) in FIG. 10.

Additionally speaking in detail, as is apparent from the relations between those waveforms (a) and (e) to (l), in the comparison between two successive pulse intervals of the input pulse sequence (a), when the preceding pulse interval is longer than the succeeding pulse interval, the original differential pulse precedes the delayed differential pulse with the positive output signal, whilst when the preceding pulse interval is shorter than the succeeding pulse interval, the delayed differential pulse precedes the original differential pulse with the negative output signal. Consequently, it is possible to control the pulse interval, namely, the repetition frequency of the input pulse sequence in response to the output signal of the above frequency differential discrimination.

As is apparent from the above explanation, according to the present invention, the fixed rate delayed pulse sequence can be obtained regardless of the variation of pulse intervals of the input pulse sequence, so that the stable and secure fixed rate delay can be performed against the wide range variaton of pulse intervals of the input pulse sequence. Besides, extensive variatons of pulse intervals thereof can be treated simply by employing in parallel plural combinations of the binary counter, the latch circuit and the exclusive OR gates for increasing number of digits of the binary number corresponding thereto, which consist in the fixed rate delay circuit according to the present invention, and further a high frequency clock-pulse generator. Moreover, since the operational treatment of binary numbers only is used for the fixed rate delay according to the present invention, the simple circuit configuration having high reliability can be attained by digitizing it.

In addition thereto, for effecting the reproduction of clock-pulses from the digital information signal on the strength of the fixed rate delay circuit according to the present invention, the stably and securely responsible clock reproduction can be performed by the similarly digitized simple circuit configuration, even when the reproduction speed of the input digital information signal is extensively varied. Besides, the further extensive variation of the reproduction speed of the input digital information signal can be dealt with by the simple additional installation of the fixed rate delay circuit according to the present invention.

Consequently, according to the present invention, the reproduction of clock-pulses can be securely and easily effected on the basis of the timing code used for the editing of the video signal by VTR as well as the digital information signal reproduced from the PCM recorder accompanied with the variaton of the tape speed. Moreover, according to the present invention, the frequency multiplication and the frequency differential discrimination can be easily performed on the basis of the pulse sequence having the extensively varied pulse intervals.

What is claimed is:

1. A fixed rate delay circuit, wherein an input pulse sequence having time varied pulse intervals is delayed sequentially at a fixed rate of one divided by an integer'th power of 2 of an immediately preceding pulse interval in order, comprising a binary counter for counting clock-pulses having a predetermined repetition interval every time prior to a reset signal applied thereto, a latch circuit for latching respectively every digit of a binary number of the clock-pulses counted by said binary counter in response to the input of a latch signal just preceding said reset signal, a timing pulse generator for generating said latch signal which consists of differential pulses corresponding respectively to each pulse of said input pulse sequence and for forming said reset signal by delaying said differential pulse by a time duration being shorter than the repetition interval of said clock-pulses, a plurality of exclusive OR gates, to respective first inputs of which every digit of said binary number of the clock-pulses counted by said binary counter is applied in order and to respective second inputs of which every digit of said binary number which is latched by said latch circuit is applied in order after being shifted down respectively by integral digits for deriving respective OR output signals when said every digit applied to the respective first inputs and every shifted down digit applied to the respective second inputs coincide with each other in order, and a NOR gate, to which the respective OR output signals of said plurality of exclusive OR gates are applied, for deriving said input pulse sequence after being delayed at said fixed rate.

2. A fixed rate delay circuit as claimed in claim 1, wherein said timing pulse generator comprises a shift register in which said input pulse sequence is shifted successively in response to said clock-pulses applied thereto at said repetition intervals, and a pair of exclusive OR gates, to which two successive shifted output signals are respectively applied in succession to each other from said shift register, for deriving respectively said latch signal and said reset signal in succession to each other, when said two successive shifted output signals are different from each other.

3. A clock-pulse reproduction circuit for reproducing a clock-pulse sequence corresponding to an input pulse sequence, wherein differential pulses corresponding respectively to each pulse of said input pulse sequence are successively gated by a gate pulse, which is formed by combining a first fixed rate delayed output pulse derived from a first fixed rate delay circuit as claimed in claim 1 in which said differential pulses are delayed at a first fixed rate of $\frac{1}{2}^m$ of said immediately preceding pulse interval, and a second fixed rate delayed output pulse derived from a second fixed rate delay circuit as claimed in claim 1 in which said differential pulses are delayed at a second fixed rate of $(1-\frac{1}{2}^n)$ of said immediately preceding pulse interval, m and n being integers.

4. A clock-pulse reproduction circuit as claimed in claim 3, wherein m and n are equal to each other.

5. A $2^N$ times frequency multiplying circuit, wherein a repetition frequency of a pulse sequence is multiplied by $2^N$, comprising a series combination of N stages of twice frequency multiplying stages which comprise respectively a $\frac{1}{2}$ rate delay circuit as claimed in claim 1 for delaying a respective input pulse sequence at the $\frac{1}{2}$ rate, and an OR gate applied with said respective input pulse sequence and a delayed pulse sequence derived from said $\frac{1}{2}$ rate delay circuit, so as to derive therefrom a respective output pulse sequence having a repetition frequency corresponding to twice the repetition frequency of said respective input pulse sequence.

6. A M times frequency multiplying circuit, wherein a repetition frequency of a pulse sequence is multiplied by an integer M, comprising a $2^N$ times frequency multiplying circuit as claimed in claim 5, which is applied with the input pulse sequence under the condition of N>M, a one K-th frequency dividing circuit which is reset by said input pulse sequence and applied with a pulse sequence having a repetition frequency corresponding to said $2^N$ times the repetition frequency of said input pulse sequence, which pulse sequence is derived from said $2^N$ times frequency multiplying circuit, under the condition of the smallest positive integer K being $K \geq 2^N/M$, and an OR gate which is applied with said input pulse sequence and another pulse sequence derived from said one K-th frequency dividing circuit, so as to derive therefrom an output pulse sequence having a repetition frequency corresponding to M-times of the repetition frequency of said input pulse sequence.

7. A frequency differential discriminator, wherein successive two pulse intervals of an input pulse sequence are compared with each other, so as to discriminate the variation of phase of a succeeding pulse in the input pulse sequence, comprising a pulse-interval sequence forming means for forming N series of successive pulse-interval sequences of said input pulse sequence, successive each one of which consists respectively of successive every other (N-1) pulse-intervals of said input pulse sequence, N fixed rate delay circuits as claimed in claim 1 for delaying leading and trailing edge pulses of each respective pulse-interval of said N series of successive pulse-interval sequences respectively at respective fixed rate of delay times being equal respectively to preceding pulse-intervals, an OR gate for forming a composite delayed edge pulse sequence which consists of a combination of respective delayed edge pulses derived from said N fixed rate delay circuits, and a phase comparator for effecting phase comparison between said composite delayed edge pulse sequence and said input pulse sequence, so as to discriminate the phase of the succeeding pulse in said input pulse sequence.

* * * * *